(12) United States Patent
Hamada et al.

(10) Patent No.: US 10,509,081 B2
(45) Date of Patent: Dec. 17, 2019

(54) MAGNETO-SENSITIVE WIRE FOR MAGNETIC IMPEDANCE SENSOR CAPABLE OF HIGH-ACCURACY MEASUREMENT AND METHOD OF MANUFACTURING SAME

(71) Applicant: AICHI STEEL CORPORATION, Tokai-shi, Aichi-ken (JP)

(72) Inventors: Norihiko Hamada, Aichi-ken (JP); Akihiro Shimode, Aichi-ken (JP); Michiharu Yamamoto, Aichi-ken (JP)

(73) Assignee: AICHI STEEL CORPORATION, Tokai-shi, Aichi-ken (JP)

( * ) Notice: Subject to any disclaimer, the term of this patent is extended or adjusted under 35 U.S.C. 154(b) by 58 days.

(21) Appl. No.: 15/552,418

(22) PCT Filed: Apr. 20, 2016

(86) PCT No.: PCT/JP2016/062556
§ 371 (c)(1),
(2) Date: Aug. 21, 2017

(87) PCT Pub. No.: WO2016/171189
PCT Pub. Date: Oct. 27, 2016

(65) Prior Publication Data
US 2018/0038919 A1    Feb. 8, 2018

(30) Foreign Application Priority Data
Apr. 21, 2015    (JP) .................. 2015-086939

(51) Int. Cl.
*G01R 33/06*    (2006.01)
*G01R 33/02*    (2006.01)
*G01R 33/00*    (2006.01)

(52) U.S. Cl.
CPC ....... *G01R 33/063* (2013.01); *G01R 33/0052* (2013.01); *G01R 33/02* (2013.01)

(58) Field of Classification Search
CPC ....... G01R 33/063; G01R 33/52; G01R 33/02
See application file for complete search history.

(56) References Cited

U.S. PATENT DOCUMENTS 4,527,614 A    7/1985    Masumoto et al.
8,610,427 B2 *    12/2013    Honkura ............... B82Y 25/00
                                                    324/244

(Continued)

FOREIGN PATENT DOCUMENTS

JP    57-079052 A    5/1982
JP    2001-025862 A    1/2001

(Continued)

OTHER PUBLICATIONS

Japanese Office Action for 2015-086939, dated Feb. 21, 2017.

(Continued)

*Primary Examiner* — Dominic E Hawkins
(74) *Attorney, Agent, or Firm* — Sughrue Mion, PLLC

(57) ABSTRACT

A magneto-sensitive wire for a magnetic impedance sensor and a method of manufacturing the same are provided which can prevent generation of abnormal noise in an output voltage and deterioration in hysteresis characteristics and enable higher-accuracy measurement than conventional magneto-sensitive wires. The magneto-sensitive wire (1) comprises an amorphous wire for detecting magnetism. The magnetic impedance sensor (6) has the magneto-sensitive wire (1) and a detection coil (3) around the magneto-sensitive wire (1). The magnetic impedance sensor (6) is configured to apply a pulse current to the magneto-sensitive wire (1) and detect a voltage generated in the detection coil (3) thereby capable of measuring strength of a magnetic field. The voltage has magnitude in response to strength of (Continued)

an external magnetic field. The magneto-sensitive wire (1) is a Co-based amorphous wire manufactured using an in-rotating liquid spinning method and finished by wire drawing. The magneto-sensitive wire (1) is subjected to removal treatment for a process-affected residual layer generated at a surface and near the surface due to finishing by the wire drawing.

2 Claims, 3 Drawing Sheets

(56) References Cited

U.S. PATENT DOCUMENTS

| | | |
|---|---|---|
| 2005/0116708 A1 | 6/2005 | Honkura et al. |
| 2005/0242805 A1 | 11/2005 | Honkura et al. |
| 2006/0038561 A1 | 2/2006 | Honkura et al. |
| 2011/0080164 A1 | 4/2011 | Honkura et al. |
| 2011/0089512 A1* | 4/2011 | Honkura ............... G01R 33/063 257/427 |
| 2011/0291649 A1* | 12/2011 | Honkura ............... G01R 33/063 324/244 |
| 2013/0038323 A1 | 2/2013 | Honkura et al. |
| 2013/0181705 A1 | 7/2013 | Honkura et al. |

FOREIGN PATENT DOCUMENTS

| | | |
|---|---|---|
| JP | 2006-300906 A | 11/2006 |
| JP | 2009-236803 A | 10/2009 |
| JP | 2009-300093 A | 12/2009 |
| JP | 2012-078198 A | 4/2012 |
| WO | 03/071299 A1 | 8/2003 |
| WO | 2005/008268 A1 | 1/2005 |
| WO | 2005/019851 A1 | 3/2005 |
| WO | 2009/044820 A | 4/2009 |
| WO | 2009/119081 A1 | 10/2009 |
| WO | 2010/097932 A1 | 9/2010 |

OTHER PUBLICATIONS

Japanese Office Action for 2015-086939, dated Jun. 29, 2016.
International Search Report for PCT/JP2016/062556, dated Jun. 28, 2016 (PCT/ISA/210).

* cited by examiner

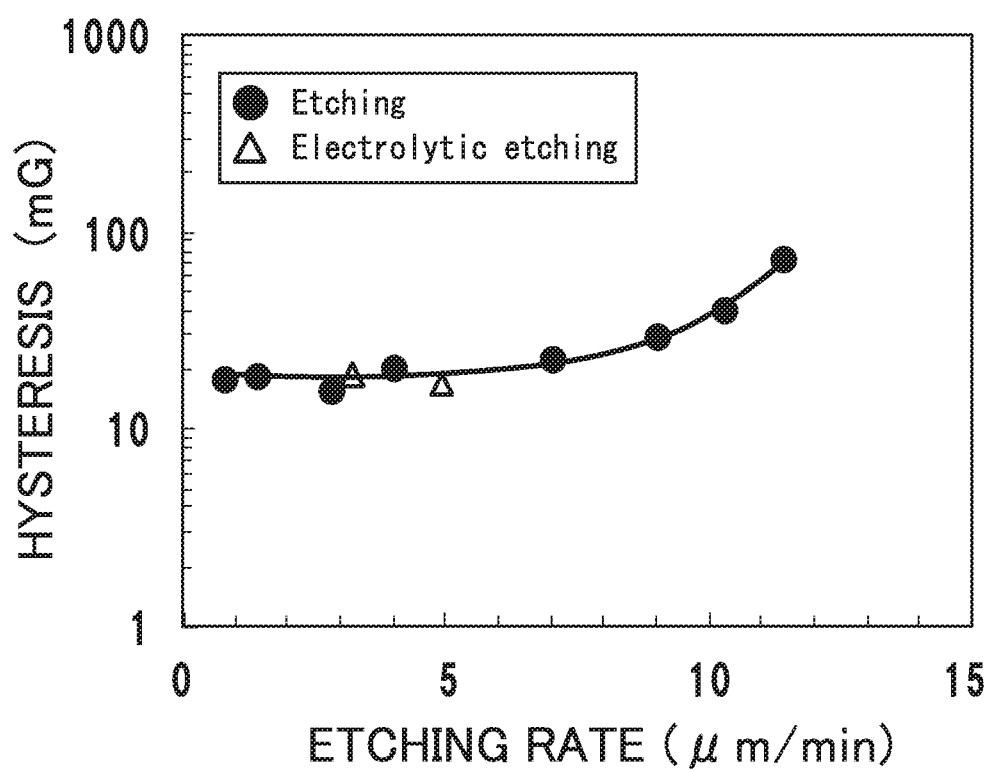

MAGNETO-SENSITIVE WIRE FOR MAGNETIC IMPEDANCE SENSOR CAPABLE OF HIGH-ACCURACY MEASUREMENT AND METHOD OF MANUFACTURING SAME

CROSS REFERENCE TO RELATED APPLICATIONS

This application is a National Stage of International Application No. PCT/JP2016/062556 filed Apr. 20, 2016, claiming priority based on Japanese Patent Application No. 2015-086939 filed Apr. 21, 2015, the contents of all of which are incorporated herein by reference in their entirety.

TECHNICAL FIELD

The present invention relates to a magneto-sensitive wire for a magnetic impedance sensor that can measure an external magnetic field with a considerably high degree of accuracy and relates also to a method of manufacturing the magneto-sensitive wire. The magneto-sensitive wire can remedy a problem of abnormal noise generated due to the Barkhausen noise which, in particular, causes the deterioration in accuracy and a problem in that excellent hysteresis characteristics cannot be obtained, and enables measurement with a higher degree of accuracy as compared with the prior art.

BACKGROUND ART

Magnetic impedance sensors of a detection coil output type are widely known in the art and used in various fields as magnetic sensors that can measure the magnetic strength with a high degree of accuracy and high responsivity.

Amorphous wires of Co-based alloy are used as magneto-sensitive bodies of the magnetic impedance sensors. Conventionally, such wires have been manufactured using an in-rotating liquid spinning method, for example, as described in Patent Literature (PTL) 1. The in-rotating liquid spinning method, which is a method of manufacturing a thin metal wire in an amorphous state, includes blowing molten metal from a nozzle by gas pressure into a centrifugally-held coolant on the inner wall of a rotating drum and thereby rapidly cooling and solidifying the molten metal. For the use as the previously-described magneto-sensitive wire, it is required for the manufactured wire to be worked into a targeted wire diameter for stabilization of the output and to have appropriate magnetic characteristics suitable for the magnetic field to be measured. The manufactured wire is therefore used as a magneto-sensitive wire for a magnetic impedance sensor after being subjected to a wire drawing process, such as using a die or dies, and heat treatment for ensuring the targeted magnetic characteristics.

CITATION LIST

Patent Literature

[PTL 1]
JP57-79052A
[PTL 2]
WO2005/019851

SUMMARY OF INVENTION

Technical Problem

It has been found, however, that the following problems occur when the amorphous wire which is manufactured through the above in-rotating liquid spinning method and subjected to the wire drawing and heat treatment is used as a magneto-sensitive wire for a magnetic impedance sensor.

The magnetic impedance sensor may be used for measurement of a very small magnetic field. For example, when detecting foreign metallic particles mixed into a food, measurement of a very small magnetic field is necessary and its magnitude may be several nT or less, that is, about one per ten thousand of the terrestrial magnetism which is detected for orientation detection in mobile devices, such as mobile phones, in recent days. When the magneto-sensitive wire manufactured using the above in-rotating liquid spinning method is used, however, abnormal noise may be accidentally generated during the measurement and generation of such abnormal noise will make it difficult to measure a very small magnetic field as the above.

In a normal state in which abnormal noise is not generated, the output voltage from a detection coil formed around the magneto-sensitive wire will be stable at a value that corresponds to normal noise without extremely large variation, provided that the magnetic field strength is constant, for example, at a state of zero. However, if the previously-described abnormal noise is generated, the voltage output which has an apparently different value than that of the normal noise is output as a positive voltage in some cases or as a negative voltage in other cases. Such abnormal noise may be instantaneous or may also continue while varying its value for a certain period of time.

When a very small magnetic field, such as of a level of several nT or less, is measured with high sensitivity despite the generation of abnormal noise as the above, the generation of the noise leads to significant deterioration in the detection resolution and the measurement of a very small magnetic field will thus be difficult.

Another problem to be solved is that excellent hysteresis characteristics cannot be obtained. For magnetic impedance sensors, improvement in the hysteresis characteristics has heretofore been contemplated. For example, as described in PTL 2, measures are taken to sample and hold the maximum value of a voltage induced in the detection coil when the pulse current is shut off, thereby improving the linearity of the output and successfully omitting a negative feedback circuit. Thus, the hysteresis characteristics have been enhanced to a certain high level. However, the demand level continues to be sophisticated more and more as time goes on and further improvement of the characteristics is needed. In particular, a function referred to as augmented reality (AR) attracts attention of users in recent years. This refers to a function to augment and display the real world using a digital device such as a smartphone. When this technology is applied to a smartphone, information regarding the landscape and buildings to be imaged on a screen can be displayed on the screen so as to be overlapped thereon. To enable such technology, the smartphone itself to which the technology is applied may have to accurately perceive its position, orientation, etc. It is thus necessary to detect the terrestrial magnetism with a higher degree of accuracy and to more accurately perceive the orientation as compared with the prior art, and further improvement in the hysteresis characteristics is strongly demanded.

The present invention has been made to solve the above problems and an object of the present invention is to provide a magneto-sensitive wire for a magnetic impedance sensor that can suppress the generation of abnormal noise which affects the measurement and can further improve the hysteresis characteristics and enable magnetism measurement with a higher degree of accuracy as compared with conventional magnetic impedance sensors, even for the use in which detection of a very small magnetic field is needed as described above. Another object of the present invention is to provide a method of manufacturing the magneto-sensitive wire.

Solution to Problem

According to a first aspect of the present invention, there is provided a magneto-sensitive wire for a magnetic impedance sensor capable of high-accuracy measurement. The magneto-sensitive wire comprises an amorphous wire for detecting magnetism. The magnetic impedance sensor has the magneto-sensitive wire and a detection coil around the magneto-sensitive wire. The magnetic impedance sensor is configured to apply a pulse current to the magneto-sensitive wire and detect a voltage generated in the detection coil thereby capable of measuring strength of a magnetic field. The voltage has magnitude in response to strength of an external magnetic field.

The magneto-sensitive wire is a Co-based amorphous wire manufactured using an in-rotating liquid spinning method and finished by wire drawing. The magneto-sensitive wire is subjected to removal treatment for a process-affected residual layer generated at a surface and near the surface due to finishing by the wire drawing. A wire diameter reduction rate due to removal of the process-affected residual layer is 0.5-60% with respect to a wire diameter before the removal treatment (claim 1).

According to a second aspect of the present invention, there is provided a method of manufacturing a magneto-sensitive wire for a magnetic impedance sensor capable of high-accuracy measurement. The magneto-sensitive wire comprises an amorphous wire for detecting magnetism. The magnetic impedance sensor has the magneto-sensitive wire and a detection coil around the magneto-sensitive wire. The magnetic impedance sensor is configured to apply a pulse current to the magneto-sensitive wire and detect a voltage generated in the detection coil thereby capable of measuring strength of a magnetic field. The voltage has magnitude in response to strength of an external magnetic field.

The method comprises: performing an in-rotating liquid spinning method and a subsequent wire drawing process to manufacture the amorphous wire; and performing removal treatment for a process-affected residual layer generated at a surface and near the surface due to finishing by the wire drawing. The removal treatment is performed under a condition in which a wire diameter reduction rate with respect to a wire diameter before the removal treatment is 0.5-60% (claim 4).

A magneto-sensitive wire for a magnetic impedance sensor may ordinarily be manufactured using the in-rotating liquid spinning method, for example, as described in PTL 1. In order that the manufactured wire can be used as the previously-described magneto-sensitive wire, it is required for the manufactured wire to be worked into a targeted wire diameter for stabilization of the quality. The thin metal wire manufactured using the previously-described in-rotating liquid spinning method is therefore ordinarily subjected to a wire drawing process, such as using a die or dies, so that the wire diameter matches a necessary wire diameter at a high degree of accuracy. During this process, the wire may be in a state in which fine irregularities remain on the surface after the finishing process or a state in which a process-affected residual layer is generated such that large strain and the like are accumulated at the surface or in the vicinity of the surface due to the wire drawing process. In some cases, an ununiform stress distribution may occur inside the process-affected residual layer and remain even when heat treatment is performed after the finishing process.

In this context, the present inventors have made intensive studies with consideration that the presence of such irregularities on the surface and residual stress remaining inside affects the existence state of magnetic domains and magnetic walls in the magneto-sensitive wire to cause disorder of spins generated in the circumferential direction on the surface when the pulse current is applied and, as a result, cause the generation of abnormal noise and deterioration in the hysteresis characteristics.

As a result of repetition of various trials and errors, a novel knowledge has been found that it is possible to drastically reduce the generation of the above abnormal noise and improve the hysteresis characteristics by modifying the prior art to use a metal fiber of an amorphous wire as an magneto-sensitive wire after removing the process-affected residual layer generated due to the wire drawing process. In the prior art, such a metal fiber of an amorphous wire is purchased from a metal fiber maker and used as a magneto-sensitive wire for a magnetic impedance sensor without performing additional special processing except the previously-described heat treatment for improvement of the magnetic characteristics. The present invention has thus been accomplished.

Here, more specifically, the removal treatment for the process-affected residual layer can be performed by etching or electrolytic etching.

As previously described, the purpose of removing the process-affected residual layer is to remove irregularities generated on the surface and near the surface due to the finishing process for the magneto-sensitive wire and remove the residual stress caused by the finishing process. It is therefore not required to remove a portion in which the influence of the process does not remain. If the amount of removal is large, it means that the time necessary for the treatment is prolonged. Thus, the amount of removal may have to be appropriately adjusted in accordance with the reduction rate of the cross-sectional area during the finishing process by wire drawing. In the present invention, the lower limit of the wire diameter reduction rate is 0.5%, but in some cases it may be preferred to adjust the wire diameter reduction rate to a higher value and perform the etching treatment, depending on the reduction rate of the cross-sectional area during the finishing process.

On the other hand, the upper limit of the wire diameter reduction rate is 60%. This is because, as the wire diameter reduction rate increases, the irregularities on the surface which appear to be generated due to the finishing process for the magneto-sensitive wire can be completely removed, while the removal treatment itself tends to newly generate irregularities to increase the surface roughness, so that the normal noise which is continuously generated during the magnetic detection increases and the effect of hysteresis improvement is liable to deteriorate. In addition, if the wire diameter reduction rate is unduly high, the etching treatment itself requires a long time to lead to poor productivity and the wire diameter decreases to reduce the output itself obtained from the detection coil, which may deteriorate the sensitivity. It may therefore be not preferred to increase the wire diameter reduction rate beyond necessity, provided that the effects of preventing the generation of abnormal noise and improving the hysteresis characteristics can be obtained. In consideration of the efficient use of the manufactured magneto-sensitive wire, the upper limit may more preferably be 30% or less.

Effect of Invention

In the present invention, treatment is performed to remove the process-affected residual layer which is generated at the surface or near the surface due to the finishing process performed in a metal fiber maker, rather than using an amorphous wire purchased from a metal fiber maker without any modification. This treatment can remove the irregularities generated on the surface during the finishing process, the residual stress generated in the process-affected residual layer, and other defects. As a result, it is possible to effectively suppress the disorder of spins caused when the pulse current is applied and prevent the generation of magnetic domains. Thus, the generation of abnormal noise and the deterioration in the hysteresis characteristics can be prevented and it is possible to manufacture a magneto-sensitive wire for a magnetic impedance sensor capable of high-accuracy measurement.

BRIEF DESCRIPTION OF DRAWINGS

FIG. 5 is a graph for describing the relationship between an etching rate and hysteresis characteristics.

DESCRIPTION OF EMBODIMENTS

Figure 1:
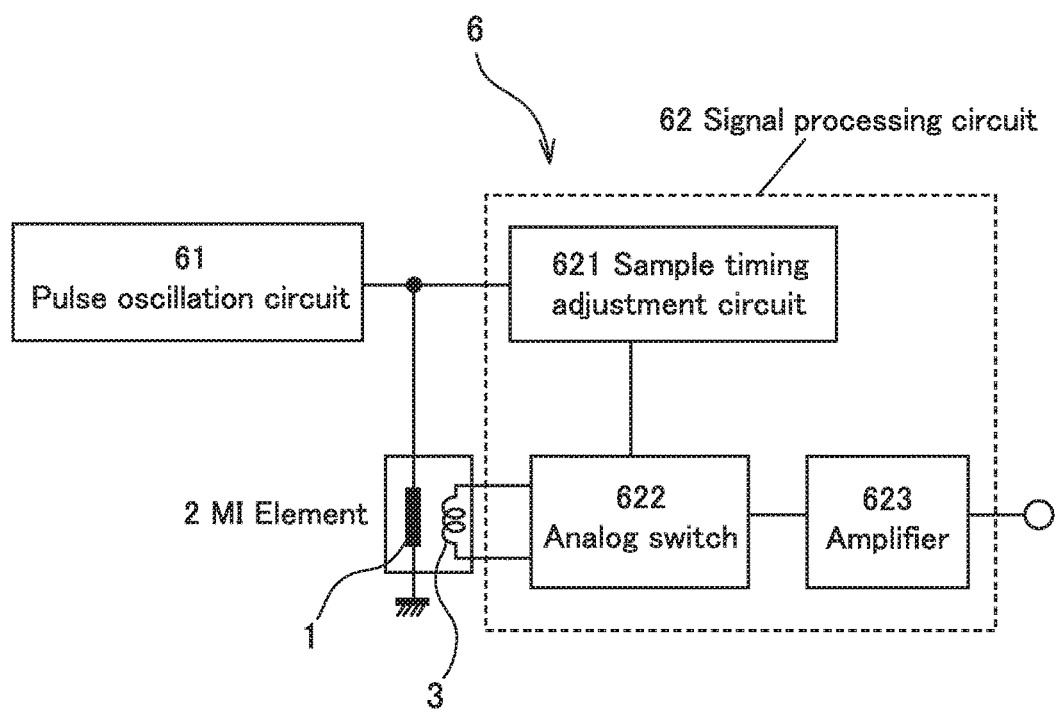
FIG. 1 is a conceptual diagram of an electronic circuit of an MI element as an example of the present invention.

Preferred embodiments of the above invention will be described.

A metal fiber manufactured using the in-rotating liquid spinning method is used as the magneto-sensitive wire. The alloy usually used is Co—Si-based alloy, specifically CoFeSiB-based alloy, and the wire diameter may be about 10 to 100 micrometers.

As previously described, the metal fiber is subjected to a wire drawing process, such as using a die or dies, to improve the dimension accuracy in the wire diameter. As a result of this process, irregularities of a depth of about several micrometers may be recognized to exist on the metal fiber surface after the wire drawing process. The irregularities appear to be generated and caused by defects and the like of the die or dies used for the wire drawing process. Due to the wire drawing process, processing effects such as residual stress remain inside the fiber and such residual stress may remain after the heat treatment for improvement of the magnetic characteristics.

The presence of the irregularities on the surface and the residual stress may cause the previously-described abnormal noise and deterioration in the hysteresis characteristics. In the present invention, therefore, treatment to remove the process-affected residual layer is performed as the pretreatment for removing the irregularities on the surface and the residual stress generated in the magneto-sensitive wire rather than using the purchased magneto-sensitive wire without modification.

More specifically, the removal treatment for the process-affected residual layer can be performed through etching by acid or electrolytic etching as described above. When the removal treatment is performed through etching treatment by acid, it can be performed by immersion in an acidic liquid, such as nitric acid, sulfuric acid, hydrochloric acid, ferric chloride, and hydrofluoric acid. When the removal treatment is performed through electrolytic etching, the flowing current may be about 10 to 70 mA and hydrochloric acid, nitric acid, or hydrogen peroxide water can be used as the electrolyte. The electrolyte can also be prepared by adding propylene glycol to hydrochloric acid or nitric acid.

The rate of the removal treatment can be controlled by adjusting the concentration and temperature of the acid or electrolyte to be used and the magnitude of the flowing current and may preferably be 10 micrometers per minute or less. This is because, as the rate of the removal treatment increases, a magneto-sensitive wire that can contribute to high-accuracy measurement can be manufactured as compared with a case in which the removal treatment is not performed at all, but the surface roughness tends to increase as in the case of increasing the wire diameter reduction rate, and the effect of enhancing the resolution and the effect of hysteresis improvement are liable to deteriorate. The temperature of the acidic liquid may preferably be 10 to 60 degrees Celsius.

In the removal treatment for the process-affected residual layer, the above irregularities, residual stress and other defects may have to be uniformly removed irrespective of the position of the metal fiber. It may therefore be necessary for the contact condition (contact time, temperature during contact, etc.) between the acidic liquid or electrolyte and the surface of the metal fiber to be continuously uniform. For example, the removal treatment may preferably be performed using a method of passing the amorphous wire through the acidic liquid or electrolyte continuously at a constant speed in a state in which certain tensile force is applied to the amorphous wire.

This treatment can effectively remove the irregularities on the surface of the amorphous wire and the process-affected residual layer due to the wire drawing process. Such effects can prevent the occurrence of magnetic domains near the surface of the amorphous wire and can also prevent the disorder of spins when the pulse current is applied. Thus, when the amorphous wire is used as a magneto-sensitive wire for a magnetic impedance sensor, the abnormal noise can be drastically reduced and the hysteresis characteristics can be improved.

With regard to the process-affected residual layer generated due to the wire drawing process, it may be scarcely possible to determine the extent of depth of micrometers to which the process-affected residual layer can be said to actually exist. That is, it may be almost impossible to determine whether the process-affected residual layer itself is completely removed after the removal treatment. The removal of the process-affected residual layer as referred to in the present invention, therefore, not only means a state of completely removing the process-affected residual layer but also means a state in which, even if the process-affected residual layer remains partially, it is sufficiently removed to an extent that is not problematic for the generation of abnormal noise and the deterioration in the hysteresis characteristics during the actual measurement. The upper limit of the wire diameter reduction rate in the removal treatment is as previously described.

A magnetic impedance element using the magneto-sensitive wire of the present invention will then be described.

As previously described, the magneto-sensitive wire of the present invention can contribute significantly to the performance improvement of a magnetic impedance sensor. As will be understood, the magneto-sensitive wire of the present invention can also be applied to an element that constitutes a part of a magnetic impedance sensor. Thus, the above effects can be effectively obtained by applying the magneto-sensitive wire as recited in claim 1 to a magnetic impedance element known in the art, that is, by simply substituting a magneto-sensitive wire as the magnetic detecting body with the magneto-sensitive wire of the present invention (claim 7). It can also be said that the magneto-sensitive wire of the present invention can be applied not only to a magnetic impedance element known in the art but also to a magnetic impedance element which is expected to be developed in the future and to which various modifications may be added regarding parts other than the magneto-sensitive wire.

The specific configuration of a magnetic impedance element is known in the art, for example, as disclosed in WO2009/044820, WO2003/071299, WO2005/8268, JP2006-300906A, JP2009-236803A, JP2009-300093A, WO2010/097932, JP2012-78198A, etc. The magneto-sensitive wire of the present invention can therefore be applied to such technologies known in the art to manufacture a magnetic impedance element capable of high-accuracy measurement.

A magnetic impedance sensor using the magneto-sensitive wire of the present invention will then be described.

As previously described, the magneto-sensitive wire of the present invention can contribute significantly to the performance improvement of a magnetic impedance sensor. Thus, the above effects can be effectively obtained by substituting the magnetic detecting body of a magnetic impedance sensor known in the art with the magneto-sensitive wire of the present invention.

For example, the magnetic impedance sensor using the magneto-sensitive wire of the present invention can be composed of the magneto-sensitive wire of the present invention used as a magnetic detecting body, a detection coil that is wound around the magneto-sensitive wire, a pulse oscillation circuit that flows a pulse current through the magneto-sensitive wire, and a signal processing circuit that converts a detection voltage of the detection coil to a signal corresponding to strength of an external magnetic field to be measured.

The configuration itself of a magnetic impedance sensor is also known in the art as disclosed in the above patent documents, etc. With regard to a sample-and-hold circuit that detects a voltage induced in the detection coil, technologies described in the previously-described PTL 2 can be applied. Details of a pulse oscillation circuit that supplies a pulse current to the magneto-sensitive wire, a circuit that detects a voltage induced in the detection coil in response to the magnitude of an external magnetic field, and other circuits are described in patent documents, etc. known in the art and the description thereof will therefore be omitted in the present description.

EXAMPLES

Hereinafter, effects obtained when the magneto-sensitive wire for a magnetic impedance sensor of the present invention is actually used for a magnetic impedance sensor will be described with reference to specific examples.

First, examples will be described in which, for a magneto-sensitive wire subjected to heat treatment to have magnetic characteristics that match the use for detecting foreign metallic particles, it has been confirmed how the generation status of abnormal noise and the magnetic resolution vary in accordance with the surface removal treatment condition. As previously described, in such a use for detecting foreign metallic particles, it is required to measure a very small magnetic field.

The magneto-sensitive wire used in the examples is a CoFeSiB-based amorphous wire having a diameter of 30.9 micrometers. The removal treatment for the process-affected residual layer was performed through two types of methods: etching by acid; and electrolytic etching. The etching by acid was carried out using 10% nitric acid such that the etching treatment time was changed at a treatment temperature of 35 degrees Celsius to vary the wire diameter reduction rate. The electrolytic etching was carried out using a solution, prepared by adding propylene glycol to hydrochloric acid, as the electrolyte. Similarly to the etching by acid, the treatment time was adjusted to vary the wire diameter reduction rate for each test specimen and studies were made for the change in the generation status of abnormal noise and the influence on the magnetic characteristics.

A method of measuring the magnetic resolution in the examples will be described below. The test was performed by experimenting in a triple magnetic shield with consideration that the external magnetic field would not affect the experiment. Each magnetic impedance element (referred to as an "MI element," hereinafter) was prepared by winding a detection coil around a magneto-sensitive wire of a length of 22 mm via an insulator. A pulse current of 20 to 70 mA corresponding to a frequency of 0.25 GHz was input to the magneto-sensitive wire in the MI element and signal processing was performed on the voltage signal generated in the detection coil to measure a peak voltage output from the detection coil. As will be understood, the configuration of the MI element described in the examples is merely an example and any element structures known in the art, such as those described in the previously-described patent documents, can be employed as the structure of the MI element.

Each magnetic impedance sensor (referred to as an "MI sensor," hereinafter) used in the examples will then be described with reference to FIG. 1. An MI sensor 6 used in the examples is composed of an MI element 2 as described above, a pulse oscillation circuit 61, and a signal processing circuit 62. The signal processing circuit 62 is composed of a sample timing adjustment circuit 621, an analog switch 622 (including a sample-and-hold circuit not illustrated), and an amplifier 623. The operation of the sensor is as follows.

First, the pulse current generated by the pulse oscillation circuit 61 is supplied to a magneto-sensitive wire 1 in the MI element 2 through an electrode (not illustrated). Then, the external magnetic field and the magnetic field in the wire circumferential direction caused by the pulse current act with each other to generate a voltage based on the spin rotation in the magneto-sensitive wire 1 in a detection coil 3 that is wound around the magneto-sensitive wire 1 via an insulator (not illustrated).

Then, after the above pulse current is supplied to the magneto-sensitive wire 1, the sample timing adjustment circuit 621 turns on and off the analog switch 622 at predetermined timing. This allows the analog switch 622 to sample and transmit a voltage generated in the detection coil 3 to the amplifier 623. This voltage reflects the magnitude of the external magnetic field.

As will be understood, the configuration described herein is merely an example and any electronic circuit known in the art, such as those described in the previously-described patent documents, can be employed.

In the examples, the magneto-sensitive wire is evaluated using a voltage that is measured by the above-described electronic circuit, but there is no possibility that the output voltage varies due to the variation of a magnetic field because the experiment is performed such that the influence of the external magnetic field is shut off by the magnetic shield. In such an environment, so-called peak-to-peak noise was measured to measure the time variation of noise that is an output voltage from the detection coil (referred to as "noise," hereinafter, because this voltage is not output due to the presence of a magnetic field). More specifically, the peak voltage generated in the detection coil due to the pulse current applied to the magneto-sensitive wire was measured for 30 minutes to obtain the difference between the maximum value and minimum value of the peak voltage during 30 minutes and the magnetic resolution was calculated by dividing the difference by the sensitivity of the magneto-sensitive wire.

When an output voltage apparently different from the output voltage considered to be at a normal noise level was recognized at least once during 30 minutes, a determination was made that abnormal noise was generated. In consideration of the use in which the magnetic field measurement is necessary with significantly high sensitivity as described above, a demand exists for a magneto-sensitive wire that does not at all generate abnormal noise for a long period of time. To this end, the test may have to be performed for a longer period of time, ideally. However, the experiment for 30 minutes allows the possibility of generation of abnormal noise to be roughly perceived and evaluated.

The test was performed under a condition in which both the rise time and fall time of the pulse current was 1 ns. As known in the art, the peak voltage can be measured at any of the rising edge and falling edge of the pulse current applied to the magneto-sensitive wire. In the examples, the measurement was performed by adjusting the sample timing of the above sample timing adjustment circuit 621 to synchronize with the falling edge.

If the abnormal noise was generated during the experiment, a voltage is output which rises at the positive side in some cases or at the negative side in other cases as compared with the output voltage due to normal noise. This results in a large difference between the maximum value and minimum value of the output voltage during the experiment to deteriorate the magnetic resolution. Table 1 lists the results of the magnetic resolution obtained by the experiment described above. In Table 1, No. 1 to No. 10 represent the results when performing the etching by acid while No. 17 and No. 18 represent the results when performing the electrolytic etching. No. 11 to No. 16 represent the experimental results of magneto-sensitive wires without any removal treatment for the surfaces.

TABLE 1

| Classification | Sample No. | Wire diameter reduction rate (%) by etching | Wire diameter (μm) | Etching rate (μm/min) | Resolution (nT) | Noise form | Note |
| --- | --- | --- | --- | --- | --- | --- | --- |
| Example material | 1 | 0.6 | 30.7 | 1.1 | 1.3 | Normal noise | |
| Example material | 2 | 2.6 | 30.1 | 1.6 | 1.0 | Normal noise | |
| Example material | 3 | 4.9 | 29.4 | 1.7 | 1.2 | Normal noise | |
| Example material | 4 | 10.7 | 27.6 | 1.7 | 0.9 | Normal noise | |
| Example material | 5 | 18.8 | 25.1 | 1.6 | 0.8 | Normal noise | |
| Example material | 6 | 25.6 | 23.0 | 1.6 | 1.1 | Normal noise | |
| Example material | 7 | 35 | 20.1 | 1.6 | 0.5 | Normal noise | |
| Example material | 8 | 50.5 | 15.3 | 1.6 | 0.9 | Normal noise | |
| Comparative material | 9 | 67 | 10.2 | 1.6 | 2.8 | Normal noise | |
| Comparative material | 10 | 79 | 6.5 | 1.6 | 10.0 | Normal noise | |
| Comparative material | 11 | 0 | 30.9 | — | 54.6 | Abnormal noise | |
| Comparative material | 12 | 0 | 30.9 | — | 33.5 | Abnormal noise | |
| Comparative material | 13 | 0 | 30.9 | — | 27.3 | Abnormal noise | |
| Comparative material | 14 | 0 | 30.9 | — | 4.7 | Abnormal noise | |
| Comparative material | 15 | 0 | 30.9 | — | 2.8 | Abnormal noise | |
| Comparative material | 16 | 0 | 30.9 | — | 1.3 | Normal noise | |
| Example material | 17 | 12 | 27.2 | 1.7 | 1.0 | Normal noise | Electrolytic etching |
| Example material | 18 | 19.8 | 24.8 | 1.6 | 1.0 | Normal noise | Electrolytic etching |

Comparative materials (No. 11 to No. 16) were each prepared such that an amorphous wire was manufactured using the in-rotating liquid spinning method in a metal fiber maker and subjected to heat treatment for adjusting the magnetic characteristics to those suitable for measurement of foreign metallic particles and the removal treatment for the surface was not performed at all. As apparent from the results of Table 1, in all of the comparative materials (No. 11 to No. 16) except No. 16, abnormal noise was generated during the test for 30 minutes and excellent magnetic resolution was thus not able to be obtained. It is found from the results that, when the removal treatment for the surface layer by etching is not performed, the abnormal noise is generated at a considerably high possibility to cause the deterioration in the magnetic resolution. The reason that the abnormal noise was not confirmed in No. 16 is considered to be due to the limited measurement time of 30 minutes and the influence of production variation. Evaluation with consideration for the production variation will be described later. Comparative materials of No. 9 and No. 10 were each prepared such that the wire diameter reduction rate was higher than 60%. In No. 9 and No. 10, abnormal noise as transitory large noise was not generated, but the magnitude of constantly-generated normal noise was large and the magnetic resolution was very poor as in the examples in which the removal treatment was not performed at all. This appears to be because, as previously described, the excessive etching treatment newly forms irregularities on the surface to increase the surface roughness and trigger the formation of magnetic domains at the surface and the normal noise thus increases. In a sensitive use such as the use for detecting foreign metallic particles, it is necessary to stably measure a very small magnetic field of 10 nT or less. To manufacture a magneto-sensitive wire for such a use, it is preferred not to increase the wire diameter reduction rate beyond necessity. This can be confirmed from the above results.

In contrast, examples of the present invention No. 1 to No. 8 (etched materials by acid) and No. 17 and No. 18 (electrolytically-etched materials) were each prepared such that the removal treatment for the surface was performed to achieve an appropriate value of the wire diameter reduction rate. In the examples of the present invention, generation of abnormal noise was not confirmed at all during the experiment for 30 minutes. It has thus been confirmed that excellent magnetic resolution of 0.50 to 1.27 nT can be obtained. It has therefore been found that, by optimizing the condition, magnetic resolution of 10 nT or less can be doubtlessly obtained and magnetic resolution of 1 nT or less can also be achieved.

Figure 2:
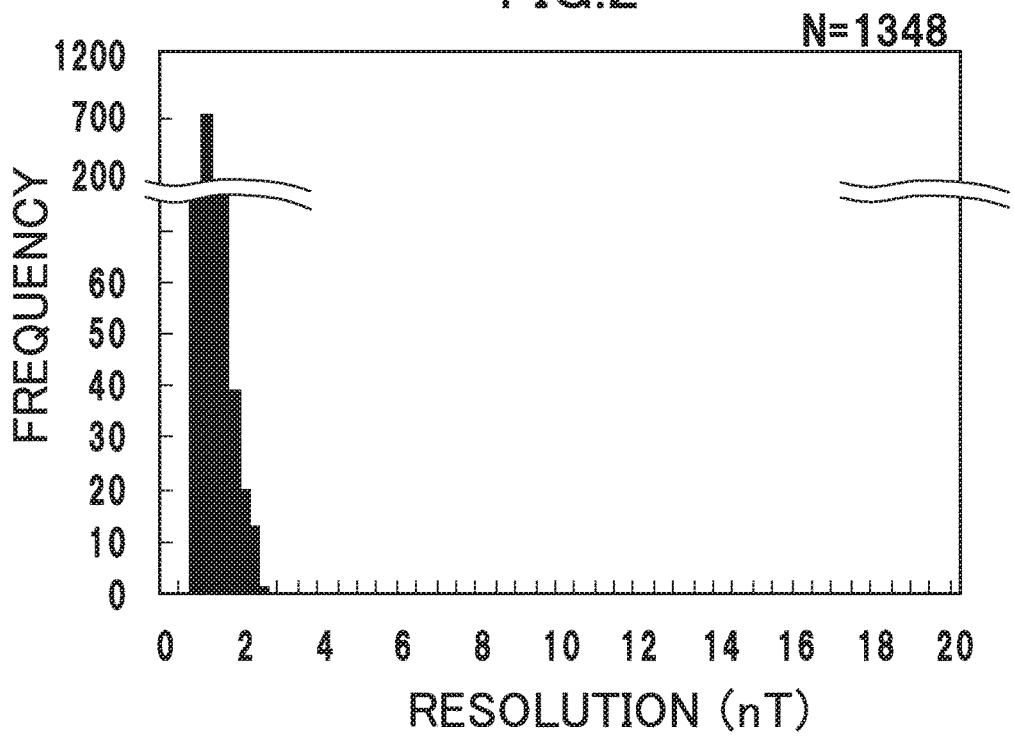
FIG. 2 is a diagram illustrating a distribution of the magnetic resolution of a magneto-sensitive wire that satisfies the condition of the present invention.

The above experiment exhibits experimental results of each individual magneto-sensitive wire. As will be understood, however, the production variation (e.g. presence or absence of surface irregularities) occurs in the magneto-sensitive wires. It is therefore important to perceive how the performance variation of a number of magneto-sensitive wires varies owing to the removal treatment for the process-affected residual layer according to the present invention. To this end, there were prepared a number of magneto-sensitive wires having a wire diameter reduction rate of 18.8% corresponding to the example material No. 5 used in the previously-described examples but with a reduced length of 6 mm and a number of magneto-sensitive wires having a wire diameter reduction rate of 0% and a length of 4 mm without performing any etching treatment, and the same experiment as the above was performed to study how the magnetic resolution varied. Results are illustrated in FIG. 2 (results of the magneto-sensitive wires for which the etching by acid was performed under the same condition as that for No. 5) and FIG. 3 (results of the magneto-sensitive wires for which the etching treatment was not performed). With expectation that the deterioration in the magnetic resolution due to the generation of abnormal noise would more significantly appear, the experiment was performed using shorter magneto-sensitive wires than those in the previously-described examples so that the diamagnetic field would become larger, the sensitivity would more deteriorate, and the generation of abnormal noise would tend to more affect the magnetic resolution, as compared with the previously-described experiment.

Figure 3:
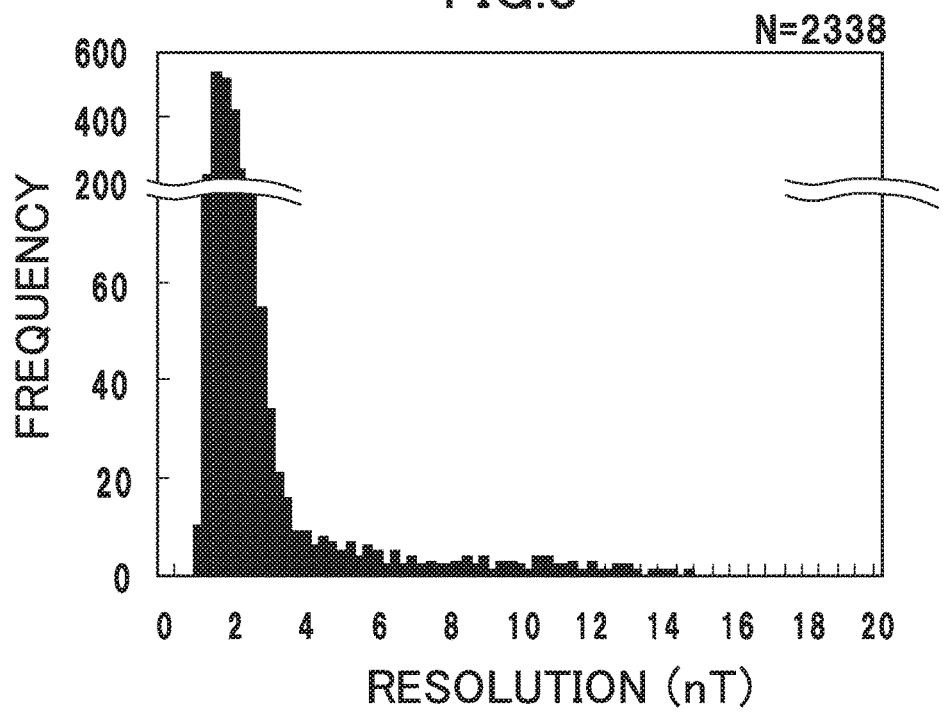
FIG. 3 is a diagram illustrating a distribution of the magnetic resolution of a magneto-sensitive wire for which the removal treatment for the process-affected residual layer is not performed.

As apparent from the results of FIG. 3, in the comparative materials without the etching treatment, generation of abnormal noise was recognized in magneto-sensitive wires corresponding to 10% of the number of samples of 2,338 measured for a test time of 30 minutes, excellent magnetic resolution was not able to be stably obtained, and a number of test results were confirmed to have magnetic resolution of more than 5 nT. The abscissa axis of FIG. 3 is limited up to 20 nT, but in a few cases the magnetic resolution deteriorates to exceed 100 nT at a maximum. It has thus been found that the use requiring the previously-described excellent magnetic resolution is absolutely difficult. With regard to the example materials of No. 5 for which the removal treatment for the process-affected residual layer was performed by etching of an appropriate amount, 1,348 samples were prepared as illustrated in FIG. 2 and the same experiment was performed. In contrast to the above comparative materials, abnormal noise was not confirmed at all, the resolution was approximately a normal distribution, there was no magneto-sensitive wire having resolution of more than 3.5 nT, and it was confirmed that excellent magnetic resolution of about 1 nT on an average was obtained.

The above results of FIGS. 2 and 3 are illustrated as results of the test for 30 minutes. The above experiment was also performed by prolonging the time for a part of the test materials. With regard to the magneto-sensitive wires of the test No. 5, abnormal noise was not recognized at all even when prolonging the test time up to one day. In contrast, with regard to the comparative materials for which the removal treatment for the process-affected residual layer was not performed, the generation rate of abnormal noise was about 10% in the case of a test time of 30 minutes, while the generation rate of abnormal noise was 50% in the case of a test time of one day. It has thus been found that the performance difference further expands than the above difference between FIG. 2 and FIG. 3. As will be understood, when the magneto-sensitive wire of the present invention is actually used for a magnetic impedance sensor, the stable magnetic resolution has to be ensured for a long period of time. In this regard, it can be said that the effects of the present invention are considerably significant. As illustrated in FIG. 3, the magnetic resolution includes unavoidable variation and, as the test time increases, a larger value than the maximum value of the magnetic resolution is detected. To stably obtain excellent magnetic resolution of 10 nT or less, therefore, it is determined that the necessary conditions are that the magnetic resolution significantly smaller than 10 nT can be ensured in the previously-described test of one sample for a short time and that the abnormal noise is not generated.

Other examples will then be described in which effects of the removal treatment for the surface layer on the hysteresis characteristics are studied.

As previously described, magnetic impedance sensors are used not only for very small magnetic field measurement of a several nT level, such as for foreign metallic particles, but also for terrestrial magnetism measurement of a level of several ten thousands of nT, such as for the purpose of orientation calculation in mobile devices. In the latter case, it is necessary to improve the accuracy, for example, to an extent that enables the display using the previously-described AR function. To this end, improvement of the hysteresis characteristics is important. In this context, tests were performed through preparing magneto-sensitive wires having a wire diameter of 14.9 micrometers (20.0 micrometers in electrolytically-etched wires) which were manufactured using the in-rotating liquid spinning method and subjected to heat treatment to have magnetic characteristics suitable for terrestrial magnetism measurement, performing the surface removal treatment for the magneto-sensitive wires having a length of 12 mm under various conditions listed in Table 2 to be described later, preparing each MI element by winding a detection coil around the magneto-sensitive wire via an insulator, disposing the prepared MI element in a magnetic field of ±200 A/m and 10 MHz, applying a pulse current of 160 mA corresponding to a frequency of 0.1 GHz to the magneto-sensitive wire from the previously-described pulse oscillation circuit 61 through an electrode, and performing signal processing on the voltage single generated in the detection coil using the same signal processing circuit as in the previously-described examples to measure the voltage. The etching by acid and the electrolytic etching were performed using the same methods as those in the previously-described examples. In a loop drawn from the magnitude of magnetic field and the measured output voltage, the difference between the applied magnetic fields when the detection coil output was 0 mV was employed as a value of the hysteresis characteristics. Results are listed in Table 2.

TABLE 2

| Classification | Sample No. | Wire diameter reduction rate (%) by etching | Wire diameter (μm) | Etching rate (μm/min) | Hysteresis (mG) | Note |
| --- | --- | --- | --- | --- | --- | --- |
| Example material | 19 | 2.9 | 14.6 | 1.4 | 27.7 | |
| Example material | 20 | 5.1 | 14.2 | 1.4 | 24.7 | |
| Example material | 21 | 12.7 | 13.1 | 1.4 | 18.7 | |
| Example material | 22 | 18.6 | 12.2 | 1.4 | 12.8 | |
| Example material | 23 | 23.1 | 11.5 | 1.4 | 18.1 | |
| Example material | 24 | 30.1 | 10.5 | 1.4 | 15.3 | |
| Example material | 25 | 33.1 | 10.0 | 1.4 | 13.0 | |
| Example material | 26 | 39.3 | 9.1 | 1.4 | 15.2 | |
| Example material | 27 | 50.0 | 7.5 | 1.4 | 30.3 | |
| Example material | 28 | 64.6 | 5.3 | 1.4 | 95.5 | |
| Comparative material | 29 | 0 | 14.9 | — | 133.3 | |
| Comparative material | 30 | 0 | 14.8 | — | 110.1 | |
| Comparative material | 31 | 0 | 14.9 | — | 120.7 | |
| Comparative material | 32 | 0 | 14.9 | — | 166.0 | |
| Example material | 33 | 4.5 | 19.1 | 1.4 | 21.0 | Electrolytic etching |
| Example material | 34 | 20.0 | 16.0 | 5.6 | 19.0 | Electrolytic etching |

As apparent from the results of Table 2, all of the comparative materials No. 29 to No. 32 for which the removal treatment for the process-affected residual layer was not performed exhibited hysteresis values of larger than 100 mG, and the hysteresis characteristics were thus poor. The wire diameter reduction rate of No. 28 is 64.8%, which falls outside the range of condition of the present invention, but a lower hysteresis value can be obtained as compared with comparative examples without the removal treatment for the surface. However, little improvement in the hysteresis characteristics is merely recognized as compared with comparative examples without the removal treatment for the surface. This appears to be because, similar to the previously-described results of the magnetic resolution, the change in the surface state when increasing the wire diameter reduction rate affects the value of the hysteresis characteristics. In contrast, No. 19 to 27, 33, and 34 are examples for which the removal treatment for the process-affected residual layer was performed using etching treatment by acid or electrolytic etching treatment so that the wire diameter reduction rate would fall within the range of the present invention. These examples exhibited hysteresis values of 13.0 to 30.3 mG, which are significantly excellent values as compared with those of the magneto-sensitive wires without the removal treatment for the surface layer. In the present invention, the upper limit of the wire diameter reduction rate is 60%, but it is considered that the wire diameter reduction rate may preferably be 30% or less, because the relationship between the wire diameter reduction rate and the hysteresis value represents an upward tendency of the wire diameter reduction rate around 30% or more, and the productivity of the removal treatment for the surface layer and the use efficiency of the wire should be improved.

Figure 4:
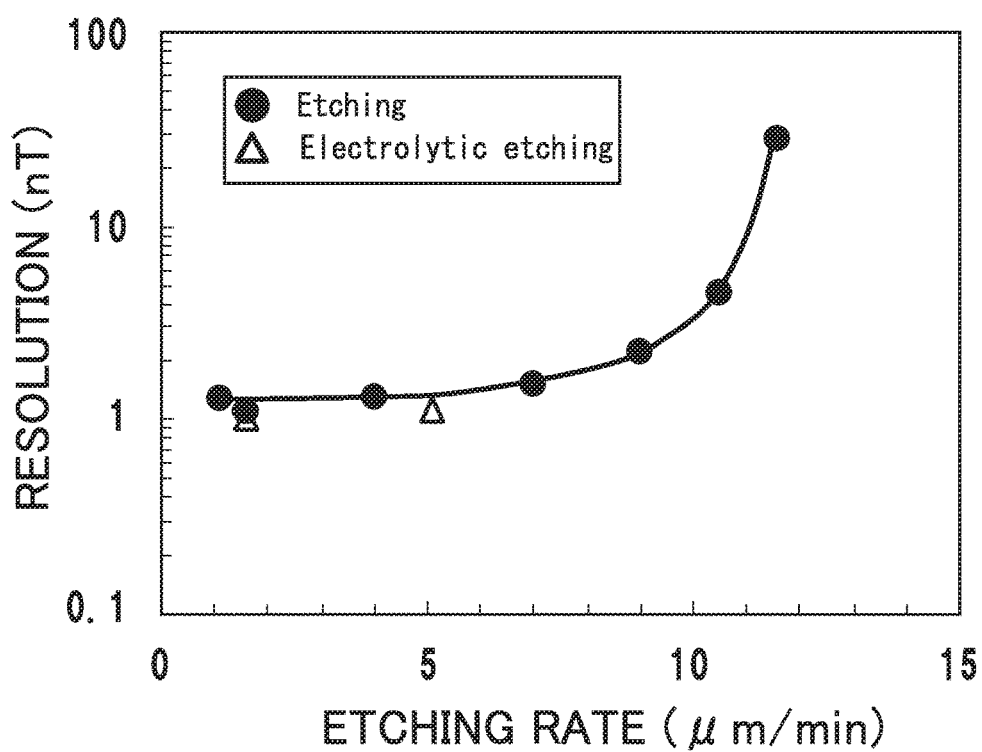
FIG. 4 is a graph for describing the relationship between an etching rate and a magnetic resolution.

Other examples for determination as to whether there is influence by the condition of etching treatment will then be described. In the etching by acid and the electrolytic etching performed for the removal treatment for the process-affected residual layer, the rate of treatment varies in accordance with the temperature and concentration of the treatment liquid. In particular, in the electrolytic etching, the rate of treatment also varies in accordance with the magnitude of the current value. If the rate of treatment varies, the surface state after the surface removal treatment will vary even with the same wire diameter reduction rate. It is therefore considered that the magnetic resolution and the hysteresis characteristics may possibly be affected. In this context, studies have been made using the same method as the previously-described experiment as to whether the two characteristics: the magnetic resolution; and the hysteresis characteristics are affected or not through varying the condition, such as the temperature and concentration of the treatment liquid and the magnitude of the current value during the electrolysis, to vary the etching rate while fixing the wire diameter reduction rate for evaluation of the magnetic resolution at 18.8%, which is the same as that for the test material No. 5, and fixing the wire diameter reduction rate for evaluation of the hysteresis characteristics at 12.7%, which is the same as that for the test material No. 21. Results are illustrated in FIGS. 4 and 5. As apparent from the results, it has been found that both the magnetic resolution and the hysteresis value tend to increase their values as the etching rate increases, while the variation is not large at a relatively small value of the rate but is steep when the rate exceeds 10 micrometers per minute. This appears to be affected by the tendency that the surface roughness increases as the removal rate increases even with the same wire diameter reduction rate. Note, however, that it has also been found that the etched test materials do not generate abnormal noise and the abnormal noise is improved as compared with the case in which the etching is not performed at all, unless the etching rate is excessively increased. It is therefore considered that the removal treatment for the process-affected residual layer may preferably be performed under a condition that the rate is ten micrometers per minute or less.

REFERENCE SIGNS LIST

1 Magneto-sensitive wire
2 MI element
3 Detection coil
6 MI sensor
61 Pulse oscillation circuit

The invention claimed is:
1. A method of manufacturing a magneto-sensitive wire for a magnetic impedance sensor capable of high-accuracy measurement,
the magneto-sensitive wire comprising an amorphous wire for detecting magnetism,
the magnetic impedance sensor having the magneto-sensitive wire and a detection coil around the magneto-sensitive wire, the magnetic impedance sensor being configured to apply a pulse current to the magneto- sensitive wire and detect a voltage generated in the detection coil thereby capable of measuring strength of a magnetic field, the voltage having magnitude in response to strength of an external magnetic field, the method comprising:

performing an in-rotating liquid spinning method and a subsequent wire drawing process to manufacture the amorphous wire; and performing removal treatment for a process-affected residual layer generated at a surface and near the surface due to finishing by the wire drawing, the removal treatment being performed under a condition in which a wire diameter reduction rate with respect to a wire diameter before the removal treatment is 0.5-30%, wherein a rate of the removal treatment for the process-affected residual layer is 10 micrometers per minute or less.

2. The method of manufacturing a magneto-sensitive wire for a magnetic impedance sensor capable of high-accuracy measurement as recited in claim 1, wherein a temperature of an acidic liquid is between 10 degrees to 60 degrees.

* * * * *